(12) United States Patent
Gan (10) Patent No.: US 11,128,121 B2
(45) Date of Patent: Sep. 21, 2021

(54) PROTECTION CIRCUIT FOR DECOUPLING A LOW VOLTAGE CIRCUITRY FROM A HIGH VOLTAGE CIRCUITRY

(71) Applicant: Intel Corporation, Santa Clara, MN (US)

(72) Inventor: Kim Sim Gan, Bukit Mertajam (MY)

(73) Assignee: Intel Corporation, Santa Clara, CA (US)

( * ) Notice: Subject to any disclaimer, the term of this patent is extended or adjusted under 35 U.S.C. 154(b) by 583 days.

(21) Appl. No.: 15/856,778

(22) Filed: Dec. 28, 2017

(65) Prior Publication Data

US 2019/0207378 A1     Jul. 4, 2019

(51) Int. Cl.
*H02H 3/20*     (2006.01)
*H03K 19/0175*     (2006.01)

(52) U.S. Cl.
CPC ....... *H02H 3/20* (2013.01); *H03K 19/017509* (2013.01)

(58) Field of Classification Search
CPC ... H02H 3/003; H02H 3/20; H03K 19/017509
USPC ...................................................... 361/91.5
See application file for complete search history.

(56) References Cited

U.S. PATENT DOCUMENTS

| | | |
|---|---|---|
| 7,154,309 B1 | 12/2006 | Talbot et al. |
| 2002/0175733 A1 | 11/2002 | Kondo |
| 2005/0285623 A1 | 12/2005 | Jahan et al. |
| 2007/0019348 A1* | 1/2007 | Bhattacharya ... H03K 19/00315 361/91.1 |
| 2009/0091870 A1* | 4/2009 | Huang ................ H02H 9/046 361/56 |
| 2009/0091871 A1 | 4/2009 | Hung |
| 2013/0170078 A1 | 7/2013 | Kumar et al. |

OTHER PUBLICATIONS

Search Report & Written Opinion dated Mar. 20, 2019 for International Patent Application No. PCT/US2018/063908.
International Preliminary Report on Patentability dated Jul. 10, 2020 for International Patent Application No. PCT/US2018/063908.

\* cited by examiner

*Primary Examiner* — Kevin J Comber
(74) *Attorney, Agent, or Firm* — Green, Howard & Mughal LLP (57) ABSTRACT

An apparatus is provided which comprises: a protection circuitry coupled between: a node and a first circuitry that is to selectively output a first voltage, the node coupled to a second circuitry that is to selectively output a second voltage, the protection circuitry comprising: a pair of complementary parallel transistors coupled between the node and the first circuitry, the pair comprising first and second transistors, wherein a gate of the first transistor is to receive a control signal at the first voltage, and a third transistor to selectively couple a gate of the second transistor to the node, a gate of the third transistor to receive the control signal at the first voltage.

25 Claims, 6 Drawing Sheets

PROTECTION CIRCUIT FOR DECOUPLING A LOW VOLTAGE CIRCUITRY FROM A HIGH VOLTAGE CIRCUITRY

BACKGROUND

Often times, an Input/Output (I/O) node may receive a relatively high voltage from a high voltage circuitry, and receive a relatively low voltage from a low voltage circuitry, e.g., in a time multiplexed manner. Without proper protection, the high voltage from the high voltage circuitry may propagate to the low voltage circuitry, thereby generating Electrical Overstress (EOS) in the low voltage circuitry, and possibly damaging one or more components of the low voltage circuitry.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

In some embodiments, a device may comprise a high voltage circuitry coupled to an Input/Output (I/O) node, and a low voltage circuitry coupled to the I/O node via a protection circuitry. For example, the high voltage circuitry may transmit and/or receive high voltage via the I/O node, and the low voltage circuitry may transmit and/or receive low voltage via the I/O node. In some embodiments, the protection circuitry may protect the low voltage circuitry from the high voltage of the high voltage circuitry.

In some embodiments, the protection circuitry may comprise a pair of complementary parallel transistors coupled between the I/O node and the low voltage circuitry, where the pair comprises first and second transistors. In an example, while the low voltage circuitry is active and the high circuitry is inactive, substantially the low voltage may be provided at a gate of the first transistor and substantially zero volts may be provided at a gate of a second transistor. In an example, while the high voltage circuitry is active and the low circuitry is inactive, substantially the low voltage may be provided at the gate of the first transistor and substantially the high voltage may be provided at the gate of the second transistor.

As discussed herein in further details, operating the pair of complementary parallel transistors in such a manner may ensure that none of the transistors of the protection circuitry may be under Electrical Overstress (EOS). As also discussed herein in further details, operating the pair of complementary parallel transistors in such a manner may also ensure that the low voltage circuitry may not be exposed to the high voltage from the high voltage circuitry. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over." "under." and the like in the description and in the claims, if any, are used for descriptive purposes and not necessarily for describing permanent relative positions.

Figure 1:
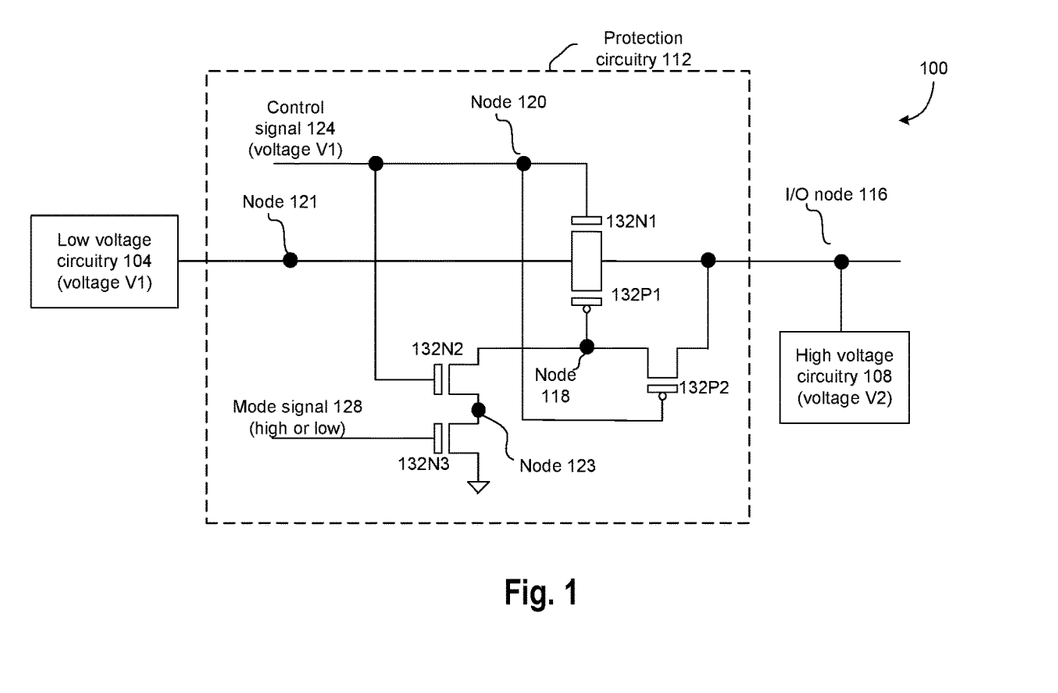
FIG. 1 illustrates a device comprising a protection circuitry to prevent Electrical Overstress (EOS) to a low voltage circuitry, where the low voltage circuitry is coupled to an Input/Output (I/O) node via the protection circuitry, and where a high voltage circuitry is coupled to the I/O node, according to some embodiments.

FIG. 1 illustrates a device 100 comprising a protection circuitry 112 to prevent EOS to a low voltage circuitry 104, where the low voltage circuitry 104 is coupled to an I/O node 116 (also referred to as node 116) via a protection circuitry 112, and where a high voltage circuitry 108 is coupled (e.g., connected directly) to the I/O node 116, according to some embodiments.

Some of the signal lines in FIG. 1 (and in various other figures herein) are illustrated to intersect each other, but they may not be electrically coupled at the intersection point, as would be readily understood by those skilled in the art. When two signal lines intersect and are electrically coupled at the intersecting point, such an intersecting point is illustrated using a small dot, as would be readily understood by those skilled in the art.

In some embodiments, the low voltage circuitry 104 (also referred to as circuitry 104) operates at a voltage V1. For example, the circuitry 104 may be a low voltage I/O circuitry that receives and/or outputs signals at the voltage V1. In an example, the circuitry 104 may be a low speed I/O interface, a high speed I/O interface, single ended or differential I/O interface, and/or the like. In the example of FIG. 1, it is assumed that the circuitry 104 uses single ended signaling. If, for example, the circuitry 104 uses differential signaling, two protection circuitries (e.g., each being similar to the protection circuitry 112) may be used for the two respective lines of the differential signal lines of the circuitry 104. Merely as examples, the circuitry 104 may be used for Low-voltage differential signaling (LVDS), Mobile Industry Processor Interface (MIPI) (e.g., MIPI Camera Serial Interface), Scalable Low-Voltage Signaling (SLVS) interface, a memory interface (e.g., a Double data rate memory interface), and/or the like.

In some embodiments, the high voltage circuitry 108 (also referred to as circuitry 108) operates at a voltage V2. For example, the circuitry 108 may be a high voltage I/O circuitry that receives and/or outputs signals at the voltage V2. In an example, the circuitry 108 may be a low speed I/O interface, a high speed I/O interface, single ended or differential I/O interface, and/or the like.

In some embodiments, the voltage V2 is higher than V1. Merely as an example, voltage V1 is substantially 1.8 Volts (V), whereas voltage V2 is substantially 3.3V, although these voltages can have any other appropriate values.

In some embodiments, the circuitries 104 and 108 may be active in a time multiplexed manner. For example, during a first time period, the circuitry 104 may be active; and during a second time period, the circuitry 108 may be active. When the circuitry 104 is active, the circuitry 104 may transmit and/or receive voltage V1 or 0 V via the node 116, or may be at a high impedance state. Similarly, when the circuitry 108 is active, the circuitry 108 may transmit and/or receive voltage V2 or 0 V via the node 116, or may be at a high impedance state.

Illustrated in FIG. 1 are nodes 116, 118, 120, 121, and 123. In some embodiments, the node 116 is a common node (e.g., comprising a bump pad) that performs on or more of: selectively outputting the voltage V1 (or 0 V) from the circuitry 104, selectively outputting the voltage V2 (or 0 V) from the circuitry 108, selectively receiving the voltage V1 or 0 V (e.g., form an external component not illustrated in FIG. 1) and transmitting the voltage V1 or 0 V to the circuitry 104, or selectively receiving the voltage V2 or 0 V (e.g., form an external component not illustrated in FIG. 1) and transmitting the voltage V2 or 0 V to the circuitry 108. For example, a mode of the device 100 dictates as to whether the node 116 operates at the voltage V1, voltage V2, or 0 V (or at a high impedance state). In another example, the mode of the device 100 dictates whether the node 116 operates as an output node (e.g., outputs voltage V1, V2, or 0 V from one of the circuitries 104, 108), operates as an input node (e.g., receives voltage V1, V2, or 0 V for one of the circuitries 104, 108), or operates in a high impedance state.

If the circuitry 104 is to be connected to the node 116, e.g., without the protection circuitry 112, the voltage V2 is to be received by the circuitry 104, whereas the circuitry 104 is rated for operating at the lower voltage V1. This would cause electrical overstress (e.g., overvoltage) at one or more components of the circuitry 104, and may possibly damage the component. Thus, in some embodiments, the protection circuitry 112 (henceforth also referred to as circuitry 112) protects the circuitry 104 from being exposed to the voltage V2.

In some embodiments, the circuitry 112 comprises transistors complimentary parallel transistors 132N1 and 132P1 coupled between the node 116 and the node 121, where the node 121 is coupled to an output of the circuitry 104. For example, the transistor 132N1 is a thick gate N type Metal-Oxide-Semiconductor Field Effect Transistor (TGNMOS). The transistor 132P1 is, for example, a thick gate P type Metal-Oxide-Semiconductor Field Effect Transistor (TGPMOS).

In some embodiments, the transistor 132N1 is coupled between the nodes 116 and 121 such that a source of the transistor 132N1 is coupled to the node 116, and a drain of the transistor 132N1 is coupled to the node 121. In some embodiments, the transistor 132P1 is coupled between the nodes 116 and 121 such that a source of the transistor 132P1 is coupled to the node 116, and a drain of the transistor 132P1 is coupled to the node 121. In some embodiments, as the transistors 132N1, 132P1 selectively allows propagation of signals between the node 116 and the circuitry 104, the transistors 132N1, 132P1 are also referred to herein as pass gate transistors.

A gate of the transistor 132N1 may be coupled to the node 120 that receives a control signal 124. In some embodiments, the control signal 124 may be substantially at the voltage V1 (e.g., at the operating voltage of the circuitry 104) during an operation of the device 100. In an example, the control signal 124 may be a constant voltage signal with voltage V1. The control signal 124 may be generated by the circuitry 104, or may be received from another appropriate component of the device 100.

In some embodiments, a transistor 132P2 may be coupled between a gate of the transistor 132P1 and the node 116. For example, a source of the transistor 132P2 is coupled to the node 116, a drain of the transistor 132P2 is coupled to the node 118, and the gate of the transistor 132P1 is coupled to the node 118. The transistor 132P2 is, for example, a TGPMOS.

In some embodiments, a pair of series connected pull-down transistors 132N2 and 132N3 is coupled between the node 118 and the ground. For example, a source of the transistor 132N2 is coupled to the node 118, a drain of the transistor 132N2 is coupled to the node 123, a source of the transistor 132N3 is coupled to the node 123, and a drain of the transistor 132N3 is coupled to the ground. The transistor 132N2 is, for example, a TGNMOS. The transistor 132N3 is, for example, a TGNMOS.

In some embodiments and as discussed herein above, the transistors 132N1, 132N2, 132N3, 132P1, and 132P2 may be thick gate transistors (e.g., thick gate transistors with V1 voltage rating, where V1 may be 1.8 V). For example, as discussed in further detail herein, a gate-source (or a gate-drain) voltage in these transistors may not exceed 1.8 V (e.g., assuming that V1 is 1.8 V, and V2 is 3.3 V).

In some embodiments, a gate of the transistor 132N2 is controlled by the control signal 124 (e.g., the gate is coupled to the node 120), where the control signal 124 may be at the voltage V1. In some embodiments, a gate of the transistor 132N3 is controlled by a mode signal 128. The mode signal 128 may be indicative of a mode of the device 100.

Merely as an example, the mode signal 128 may be at a logical 0 value (e.g., at 0 V) when the circuitry 108 is activated (e.g., and the circuitry 104 is not activated, and does not output or receive the voltage V1). Merely as an example, the mode signal 128 may be at a logical 1 value when the circuitry 104 is activated (e.g., and the circuitry 108 is not activated, and does not output or receive the voltage V2). In some embodiments, the logical 1 of the mode signal 128 may be substantially equal to the voltage V1. Thus, the mode signal 128 may be substantially at voltage V1 when the circuitry 104 is activated.

Figure 2:
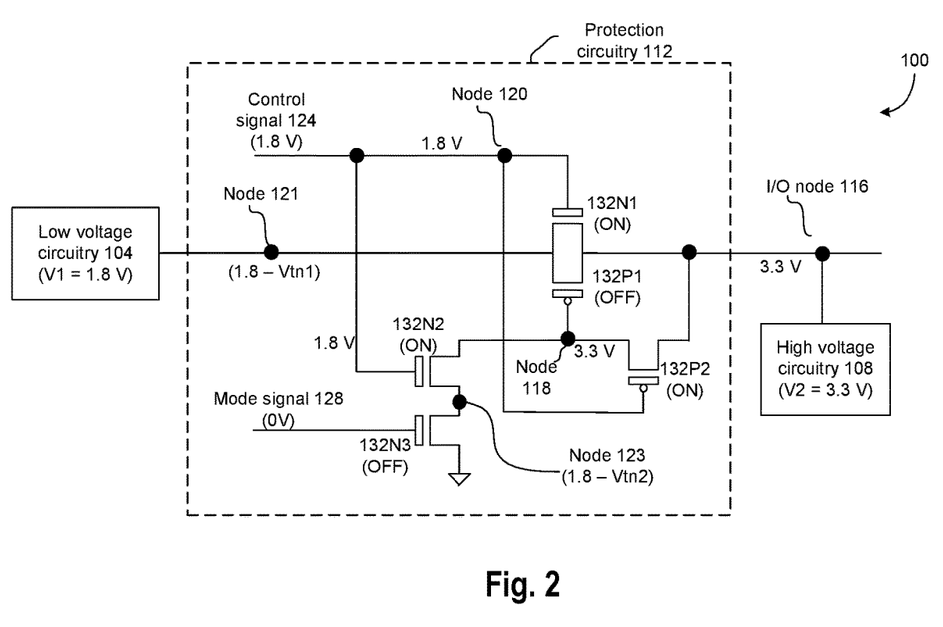
FIG. 2 illustrates an operation of the device of FIG. 1 while the device operates in a first mode, during which the high voltage circuitry transmits high voltage to the I/O node or receives the high voltage from the I/O node, according to some embodiments.

FIG. 2 illustrates an operation of the device 100 of FIG. 1 while the device 100 operates in a first mode, during which the high voltage circuitry 108 transmits voltage V2 to the node 116 or receives voltage V2 from the node 116, according to some embodiments. In the example of FIG. 2, the voltages V1 and V2 of the circuitries 104 and 108 are respectively assumed to be 1.8 V and 3.3 V. However, such values of the voltages V1 and V2 are merely examples, and do not in any way limit the teachings of this disclosure.

In the example of FIG. 2, it is assumed that the device 100 operates in the first mode of operation, during which the circuitry 108 transmits voltage V2 (e.g., 3.3 V) to the node 116 or receives voltage V2 from the node 116. The circuitry 104 is assumed to not receive any voltage from the node 116, or transmit any voltage to the node 116. As discussed herein previously, the mode signal 128 for the first mode may be at a logical 0 value, e.g., 0 V.

It may be noted that the first mode of operation of the device 100 may comprise two sub-modes. For example, a first sub-mode may be associated with the circuitry 108 transmitting voltage V2 over the node 116 to an external component (e.g., which may be coupled to the node 116, not illustrated in FIG. 2); and a second sub-mode may be associated with the circuitry 108 receiving voltage V2 over the node 116 from another external component. During the first mode of operation, the device 100 may operate in any of these two sub-modes.

During the first mode of FIG. 2, the node 116 may be at 3.3 V (e.g., which may be either received by the circuitry 108 from an external component, or which may be transmitted by the circuitry 108 to an external component). Also, as discussed with respect to FIG. 1, the control signal 124 may be at voltage V1, e.g., at 1.8 V (e.g., the node 120 may be at voltage V1).

As the voltage at the node 116 is at 3.3 V and the voltage at the gate of the transistor 132P2 is at 1.8 V, the transistor 132P2 may be turned ON. As the gate voltage of the transistor 132P2 is 1.8 V, there may not be EOS on the transistor 132P2. The transistor 132P2 may propagate the 3.3 V from the node 116 to the node 118, which may be received by the gate of the transistor 132P1. As the transistor 132P1 receives 3.3 V at the gate and 3.3 V at the source, the transistor 132P1 may be turned OFF. In an example, this may prevent propagation of 3.3 V from the node 116 to the node 121 via the transistor 132P1.

In some embodiments, the transistor 132N1 may receive 1.8 V at the gate and 3.3 V at its source. Thus, the transistor 132N1 may be turned ON, and may merely propagate (1.8 V−Vtn1) from the node 116 to the node 121 (e.g., as the gate is at 1.8 V), where Vtn1 may be a threshold voltage of the transistor 132N1.

In some embodiments, the transistor 132N2 may be ON (e.g., as the gate is at 1.8 V, and the source is at 3.3 V), and the transistor 132N2 may propagate (1.8 V−Vtn2) from the node 118 to the node 123 (e.g., as the gate is at 1.8 V). In some embodiments, the transistor 132N3 may be OFF, e.g., as the gate is at 0 V. Thus, the transistor 132N2 may clamp the node 123 to (1.8 V−Vtn2), thereby preventing EOS on the transistor 132N3. The pull-down transistors 132N2 and 132N3 may not pull down the node 118 to the ground.

Thus, in the first mode of operation, as discussed with respect to FIG. 2, the transistor 132P1 is OFF, and the transistor 132N1 may be ON and may merely propagate (1.8 V−Vtn1) to the circuitry 104. This may prevent the circuitry 104 from being exposed to higher than 1.8 V, e.g., thereby protecting the circuitry 104 from EOS from higher voltages (e.g., voltages higher than 1.8 V).

Figure 3:
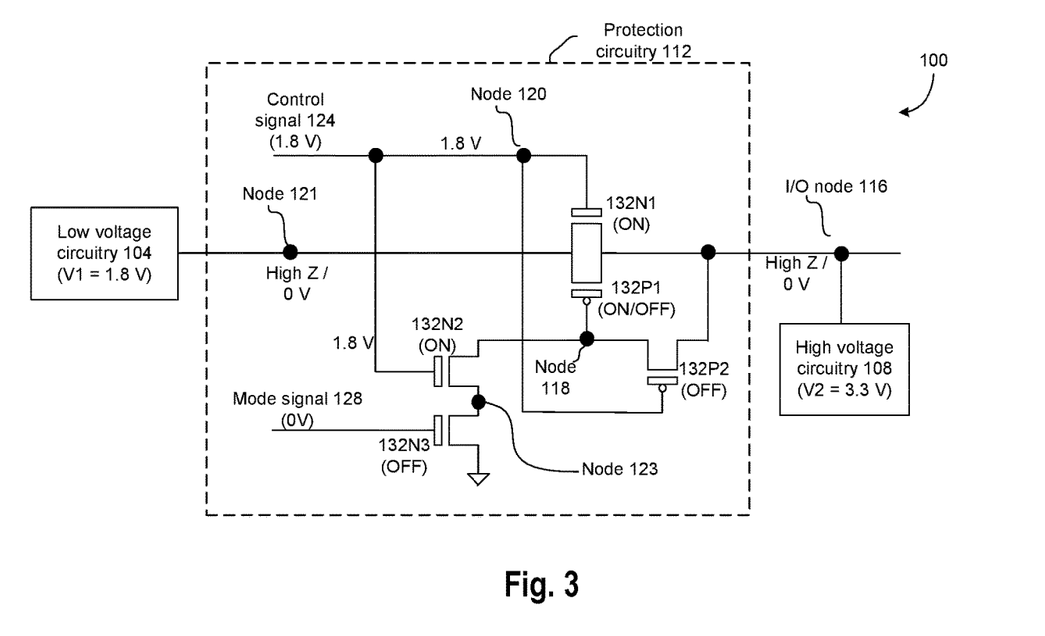
FIG. 3 illustrates an operation of the device of FIG. 1 while the device operates in a second mode, during which the high voltage circuitry transmits 0 V to the I/O node, receives 0 V from the I/O node, or is at a tristate or high impedance state, according to some embodiments.

FIG. 3 illustrates an operation of the device 100 of FIG. 1 while the device 100 operates in a second mode, during which the high voltage circuitry 108 transmits 0 V to the node 116, receives 0 V from the node 116, or is at a tristate or high impedance state (e.g., with high impedance Z), according to some embodiments. In the example of FIG. 3, the voltages V1 and V2 of the circuitries 104 and 108 are respectively assumed to be 1.8 V and 3.3 V. However, such values of the voltages V1 and V2 are merely examples, and do not in any way limit the teachings of this disclosure.

It may be noted that the second mode of operation of the device 100 may comprise three sub-modes. For example, a first sub-mode may be associated with the circuitry 108 transmitting 0 V over the node 116 to an external component (e.g., which may be coupled to the node 116, not illustrated in FIG. 3); a second sub-mode may be associated with the circuitry 108 receiving 0 V over the node 116 from another external component; and a third sub-mode may be associated with the circuitry 108 being in a high impedance state. During the second mode of operation, the device 100 may operate in any one or more of these three sub-modes.

In the example of FIG. 3, it is assumed that the device 100 operates in the second mode of operation, during which the circuitry 108 is active and the circuitry 104 is assumed to not receive any voltage from the node 116, or transmit any voltage to the node 116. The mode signal 128 for the second mode may be at a logical 0 value, e.g., 0 volts.

During the second mode of FIG. 3, the node 116 may be at 0 V or at high impedance Z. Also, as discussed with respect to FIG. 1, the control signal 124 may be at voltage V1, e.g., at 1.8 V (e.g., the node 120 may be at voltage V1). Thus, transistor 132N1 may be ON. The transistor 132N1 may propagate the 0 V or the high impedance Z state from the node 116 to the node 121, and to the circuitry 104.

As the source of the transistor 132P2 may be at 0 V and the gate may be at 1.8 V, the transistor 132P2 may be OFF. The transistor 132N3 may be OFF (e.g., as the gate is at 0 V). Thus, the nodes 118 and/or 132 may be floating. The transistor 132P1 may be ON or OFF (e.g., based on the voltage of the floating node 118)—but the state of the transistor 132P1 may not matter (e.g., as the transistor 132P1 may not need to propagate between nodes 121 and 116; and even if the transistor 132P1 propagates, it may merely propagate the 0 V or high impedance Z state to the node 121). None of the transistors of the protection circuitry 112 may be under EOS, as the maximum voltage in the circuitry 112 may be 1.8 V.

Figure 4:
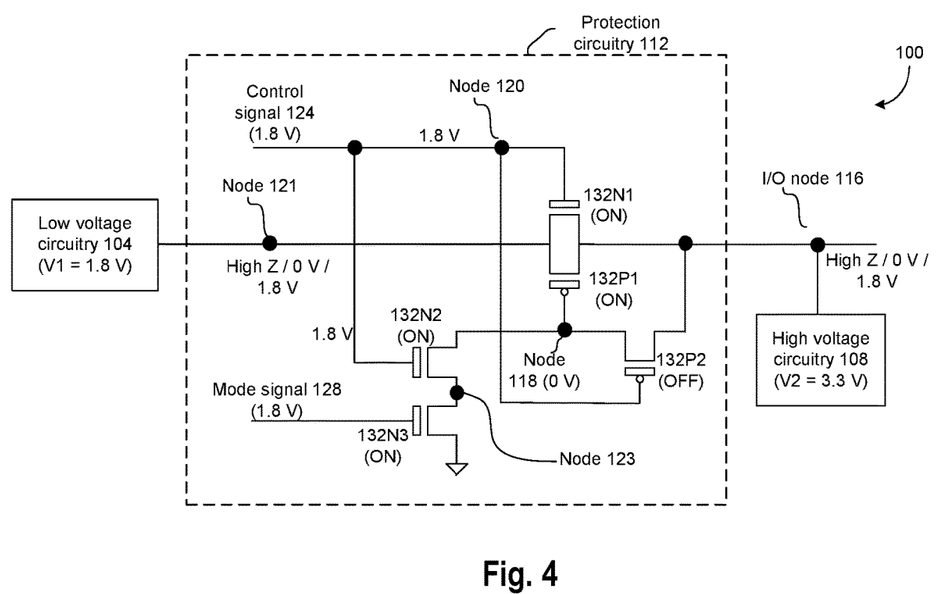
FIG. 4 illustrates an operation of the device of FIG. 1 while the device operates in a third mode, during which the low voltage circuitry transmits low voltage to the I/O node, receives the low voltage from the I/O node, transmits 0 V to the I/O node, receives 0 V from the I/O node, or is in a tristate or high impedance state, according to some embodiments.

FIG. 4 illustrates an operation of the device 100 of FIG. 1 while the device 100 operates in a third mode, during which the low voltage circuitry 104 transmits voltage V1 to the node 116, receives voltage V1 from the node 116, transmits 0 V to the node 116, receives 0 V from the node 116, or is in a tristate or high impedance state, according to some embodiments. In the example of FIG. 4, the voltages V1 and V2 of the circuitries 104 and 108 are respectively assumed to be 1.8 V and 3.3 V. However, such values of the voltages V1 and V2 are merely examples, and do not in any way limit the teachings of this disclosure.

It may be noted that the third mode of operation of the device 100 may comprise five sub-modes. For example, a first sub-mode may be associated with the circuitry 104 transmitting voltage V1 over the node 116 to an external component (e.g., which may be coupled to the node 116, not illustrated in FIG. 4); a second sub-mode may be associated with the circuitry 104 receiving voltage V1 over the node 116 from another external component; a third sub-mode may be associated with the circuitry 104 transmitting 0 V over the node 116 to another external component; a fourth sub-mode may be associated with the circuitry 104 receiving 0 V over the node 116 from another external component; and a fifth sub-mode may be associated with the circuitry 104 being in a high impedance state. During the third mode of operation, the device 100 may operate in any one or more of these five sub-modes.

In the example of FIG. 4, it is assumed that the device 100 operates in the third mode of operation, during which the circuitry 104 is active; and the circuitry 108 is assumed to not receive any voltage from the node 116, or transmit any voltage to the node 116. As discussed herein previously, the mode signal 128 for the third mode may be at a logical 1 value, e.g., at substantially 1.8 V.

During the third mode of FIG. 4, the node 116 may be at 0 V, 1.8 V, or at a high impedance state (e.g., based on a sub-mode of the third mode in which the device 100 is operating). Also, as discussed with respect to FIG. 1, the control signal 124 may be at voltage V1, e.g., at substantially 1.8 V (e.g., the node 120 may be at voltage V1).

As the voltage at the node 116 is at 0 V or 1.8 V, and the voltage at the gate of the transistor 132P2 is at 1.8 V, the transistor 132P1 may be turned OFF. Also, as the gates of the transistors 132N2 and 132N3 may be at 1.8 V, the pull-down transistors 132N2 and 132N3 may be turned ON. Thus, the node 118 may be pulled down to ground potential. Accordingly, the transistor 132P1 may be ON. Also, as the gate of the transistor 132N1 is at 1.8 V and the source is at one of 0 V or 1.8 V, the transistor 132N1 may also be ON.

Thus, both the pass-gate transistors 132N1 and 132P1 are turned ON, thereby propagating 0 V or 1.8 V from node 121 to node 116, or from node 116 to node 121 (e.g., based on a sub-mode of the third mode of operation). None of the transistors of the protection circuitry 112 may be under EOS, as the maximum voltage in the circuitry 112 may be 1.8 V.

Figure 5:
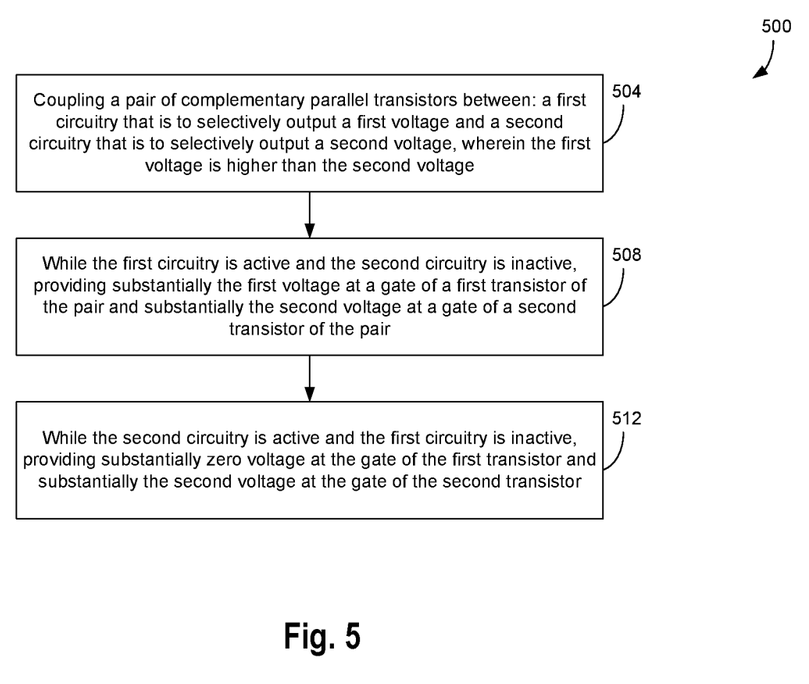
FIG. 5 illustrates a flowchart depicting a method for operating the device of FIGS. 1-4, according to some embodiments.

FIG. 5 illustrates a flowchart depicting a method 500 for operating the device 100 of FIGS. 1-4, according to some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 may be optional in accordance with certain embodiments. The numbering of the blocks presented is for the sake of clarity and is not intended to prescribe an order of operations in which the various blocks must occur.

In some embodiments, the method 500 comprises, at 504, coupling a pair of complementary parallel transistors (e.g., transistors 132N1 and 132P1) between: a first circuitry (e.g., circuitry 108) that is to selectively output a first voltage (e.g., voltage V2) and a second circuitry (e.g., circuitry 104) that is to selectively output a second voltage (e.g., voltage V1), wherein the first voltage is higher than the second voltage. In some embodiments, the method 500 comprises, at 508, while the first circuitry is active and the second circuitry is inactive, providing substantially the first voltage at a gate of a first transistor (e.g., transistor 132P1) of the pair and substantially the second voltage at a gate of a second transistor (e.g., transistor 132N1) of the pair, e.g., as discussed with respect to FIG. 2. In some embodiments, the method 500 comprises, at 512, while the second circuitry is active and the first circuitry is inactive, providing substantially zero voltage at the gate of the first transistor and substantially the second voltage at the gate of the second transistor, e.g., as discussed with respect to FIG. 4.

Figure 6:
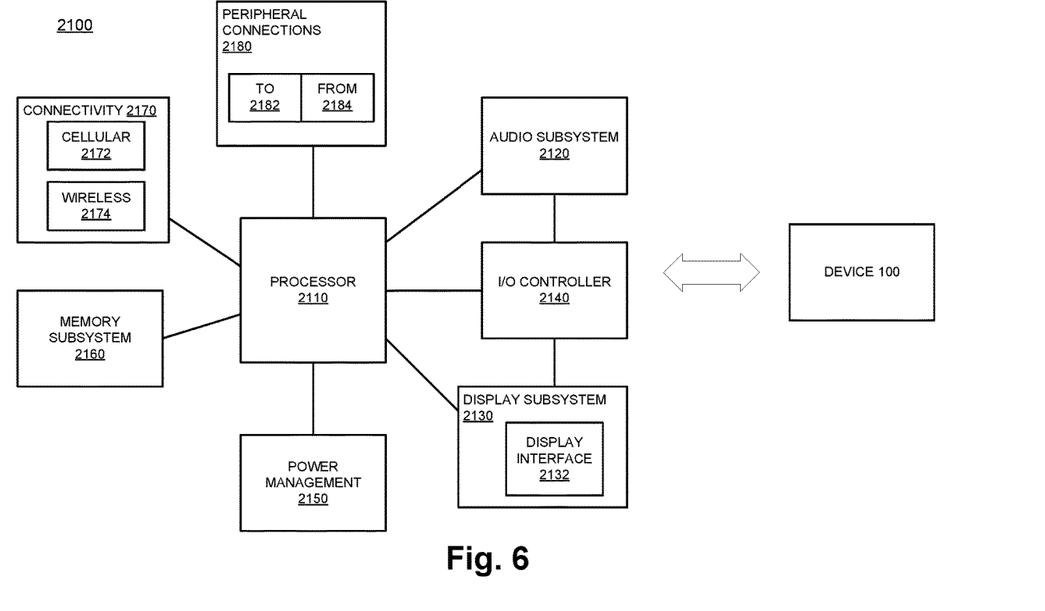
FIG. 6 illustrates a computing device, a smart device, a computing device or a computer system or a SoC (System-on-Chip), where the computing device may comprise a high voltage circuitry, a low voltage circuitry, and a protection circuitry to protect the low voltage circuitry from the high voltage circuitry, according to some embodiments.

FIG. 6 illustrates a computing device, a smart device, a computing device or a computer system or a SoC (System-on-Chip), where the computing device may comprise the high voltage circuitry 108, the low voltage circuitry 104, and the protection circuitry 112 to protect the low voltage circuitry 104 from the high voltage circuitry 108, according to some embodiments. It is pointed out that those elements of FIG. 6 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the device 100 of FIG. 1. In some embodiments, the device 100 may operate in one of various modes discussed with respect to FIGS. 2-4. In some embodiments, the processor 2110 or another component of the computing device 2100 may control the circuitries 104 and/or 108. In some embodiments, the circuitries 104 and/or 108 may provide voltages V1 and/or V2 to any appropriate component of the computing device 2100, e.g., to the processors 2110, a memory of the memory subsystem 2160, an I/O port or an I/O interface, and/or any other component of the computing device 2100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a node; and a protection circuitry coupled between: the node and a first circuitry that is to selectively output a first voltage, wherein the node is coupled to a second circuitry that is to selectively output a second voltage, wherein the protection circuitry comprises: a pair of complementary parallel transistors coupled between the node and the first circuitry, the pair comprising first and second transistors, wherein a gate of the first transistor is to receive a control signal at the first voltage, and a third transistor to selectively couple a gate of the second transistor to the node, a gate of the third transistor to receive the control signal at the first voltage.

Example 2

The apparatus of example 1 or any other example, wherein the protection circuitry comprises: a fourth transistor and a fifth transistor in series, wherein the fourth and fifth transistors are to selectively couple the gate of the second transistor to a ground terminal.

Example 3

The apparatus of example 2 or any other example, wherein: a gate of the fourth transistor is to receive the control signal at the first voltage.

Example 4

The apparatus of example 2 or any other example, wherein: a gate of the fifth transistor is to receive a mode signal that is based on an operational mode of the apparatus.

Example 5

The apparatus of example 4 or any other example, further comprising: a circuitry to: generate the mode signal at a logical high value when the first circuitry is to be active, and generate the mode signal at a logical low value when the second circuitry is to be active.

Example 6

The apparatus of example 5 or any other example, wherein the logical high value substantially corresponds to the first voltage and the logical low value substantially corresponds to zero volts.

Example 7

The apparatus of example 2 or any other example, wherein: the fourth transistor is a first thick gate N type Metal-Oxide-Semiconductor Field Effect Transistor (TGNMOS); and the fifth transistor is a second TGNMOS.

Example 8

The apparatus of any of examples 1-7 or any other example, wherein: the first transistor, the second transistor, and the third transistor are thick gate transistors relative to another thin gate transistor in the apparatus.

Example 9

The apparatus of any of examples 1-7 or any other example, wherein: the first transistor is a thick gate N type Metal-Oxide-Semiconductor Field Effect Transistor (TGNMOS); the second transistor is a first thick gate P type Metal-Oxide-Semiconductor Field Effect Transistor (TGP-MOS); and the third transistor is a second TGPMOS.

Example 10

The apparatus of any of examples 1-7 or any other example, wherein: the first voltage is substantially lower than the second voltage.

Example 11

A system comprising: a memory to store instructions; a processor coupled to the memory, the processor to execute the instructions; a wireless interface to allow the processor to communicate with another system; a first circuitry to selectively output a first voltage to a node; a second circuitry to selectively output a second voltage, the processor to control an operation of one or both the first circuitry or the second circuitry; a first transistor and a second transistor coupled between the node and the second circuitry, wherein a gate of the first transistor is to receive a control signal at the first voltage; and an arrangement to provide, to a gate of the second transistor, one of: substantially the first voltage or substantially zero volts.

Example 12

The system of example 11 or any other example, wherein the arrangement comprises: a third transistor coupled between the gate of the second transistor and the node, a gate of the third transistor to receive the control signal at the first voltage.

Example 13

The system of example 12 or any other example, wherein the arrangement comprises: one or more pull down transistors between the gate of the second transistor and a ground terminal.

Example 14

The system of example 13 or any other example, wherein: a gate of a first pull down transistor of the one or more pull down transistors is to receive the control signal at the first voltage.

Example 15

The system of example 14 or any other example, wherein: a gate of a second pull down transistor of the one or more pull down transistors to receive a mode signal that is based on an operational mode of the first and second circuitries, the first pull down transistor and the second pull down transistor coupled in series.

Example 16

The system of example 15 or any other example, further comprising: a circuitry to: generate the mode signal at substantially the second voltage when the second circuitry is to be active, and generate the mode signal at substantially zero volts when the first circuitry is to be active.

Example 17

An apparatus comprising: a first circuitry that is to selectively output a first voltage at a first output terminal; a second circuitry that is to selectively output a second voltage at a second output terminal; a pair of parallel transistors coupled between the first output terminal and the second output terminal, the pair comprising first and second transistors, wherein a gate of the first transistor is to receive a control signal at the first voltage; and a third transistor to selectively couple a gate of the second transistor to the second output terminal, a gate of the third transistor to receive the control signal at the first voltage.

Example 18

The apparatus of example 17 or any other example, further comprising: a fourth transistor and a fifth transistor in series, wherein the fourth and fifth transistors are to selectively couple the gate of the second transistor to a ground terminal.

Example 19

The apparatus of example 18 or any other example, wherein: a gate of the fourth transistor is to receive the control signal at the first voltage.

Example 20

The apparatus of any of examples 18-19 or any other example, wherein: a gate of the fifth transistor is to receive a mode signal that is based on an operational mode of the apparatus.

Example 21

A method comprising: coupling a pair of complementary parallel transistors between: a first circuitry that is to selectively output a first voltage and a second circuitry that is to selectively output a second voltage, wherein the first voltage is higher than the second voltage; while the first circuitry is active and the second circuitry is inactive, providing substantially the first voltage at a gate of a first transistor of the pair and substantially the second voltage at a gate of a second transistor of the pair; and while the second circuitry is active and the first circuitry is inactive, providing substantially zero voltage at the gate of the first transistor and substantially the second voltage at the gate of the second transistor.

Example 22

The method of example 21 or any other example, wherein providing substantially the first voltage at the gate of the first transistor comprises: coupling a third transistor between the first circuitry and the gate of the first transistor; and while the first circuitry is active and the second circuitry is inactive, turning on the third transistor to provide substantially the first voltage at the gate of the first transistor.

Example 23

The method of example 21 or any other example, wherein providing substantially zero voltage at the gate of the first transistor comprises: coupling a third transistor between the first circuitry and the gate of the first transistor; coupling one or more pull down transistors between the gate of the first transistor and a ground terminal; and while the second circuitry is active and the first circuitry is inactive, turning off the third transistor and turning on the one or more pull down transistors, to provide substantially zero voltage at the gate of the first transistor.

Example 24

The method of example 23 or any other example, further comprising: providing a mode signal to a first pull down transistor of the one or more pull down transistors; generating the mode signal at a logical high value, while the first circuitry is active and the second circuitry is inactive; and generating the mode signal at a logical low value, while the second circuitry is active and the first circuitry is inactive.

Example 25

An apparatus comprising: means for performing the method of any of the examples 21-24 or any other example.

Example 26

An apparatus comprising: means for coupling a pair of complementary parallel transistors between: a first circuitry that is to selectively output a first voltage and a second circuitry that is to selectively output a second voltage, wherein the first voltage is higher than the second voltage; means for providing, while the first circuitry is active and the second circuitry is inactive, substantially the first voltage at a gate of a first transistor of the pair and substantially the second voltage at a gate of a second transistor of the pair; and means for providing, while the second circuitry is active and the first circuitry is inactive, substantially zero voltage at the gate of the first transistor and substantially the second voltage at the gate of the second transistor.

Example 27

The apparatus of example 26 or any other example, wherein the means for providing substantially the first voltage at the gate of the first transistor comprises: means for coupling a third transistor between the first circuitry and the gate of the first transistor; and means for turning on, while the first circuitry is active and the second circuitry is inactive, the third transistor to provide substantially the first voltage at the gate of the first transistor.

Example 28

The apparatus of example 26 or any other example, wherein the means for providing substantially zero voltage at the gate of the first transistor comprises: means for coupling a third transistor between the first circuitry and the gate of the first transistor; means for coupling one or more pull down transistors between the gate of the first transistor and a ground terminal; and means for turning off, while the second circuitry is active and the first circuitry is inactive, the third transistor and turning on the one or more pull down transistors, to provide substantially zero voltage at the gate of the first transistor.

Example 29

The apparatus of example 28 or any other example, further comprising: means for providing a mode signal to a first pull down transistor of the one or more pull down transistors; means for generating the mode signal at a logical high value, while the first circuitry is active and the second circuitry is inactive; and means for generating the mode signal at a logical low value, while the second circuitry is active and the first circuitry is inactive.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a node; and
   a protection circuitry coupled between: the node and a first circuitry that is to selectively output from a selection a first voltage or a ground voltage during operation of the first circuitry, wherein the node is coupled to a second circuitry that is to selectively output from a selection a second voltage or a ground voltage during operation of the second circuitry, and wherein the protection circuitry comprises:
   a pair of complementary parallel transistors coupled between the node and the first circuitry, the pair comprising first and second transistors, wherein a gate of the first transistor is to receive a control signal at the first voltage; and
   a third transistor to selectively couple a gate of the second transistor to the node, a gate of the third transistor to receive the control signal at the first voltage.

2. The apparatus of claim 1, wherein the protection circuitry comprises:
   a fourth transistor and a fifth transistor in series, wherein the fourth and fifth transistors are to selectively couple the gate of the second transistor to a ground terminal.

3. The apparatus of claim 2, wherein:
   a gate of the fourth transistor is to receive the control signal at the first voltage.

4. The apparatus of claim 2, wherein:
   a gate of the fifth transistor is to receive a mode signal that is based on an operational mode of the apparatus.

5. The apparatus of claim 4, further comprising:
   a circuitry to: generate the mode signal at a logical high value when the first circuitry is to be active, and generate the mode signal at a logical low value when the second circuitry is to be active.

6. The apparatus of claim 5, wherein the logical high value substantially corresponds to the first voltage and the logical low value substantially corresponds to zero volts.

7. The apparatus of claim 2, wherein:
   the fourth transistor is a first thick gate N type Metal-Oxide-Semiconductor Field Effect Transistor (TGNMOS); and
   the fifth transistor is a second TGNMOS.

8. The apparatus of claim 1, wherein:
   the first transistor, the second transistor, and the third transistor are thick gate transistors relative to another thin gate transistor in the apparatus.

9. The apparatus of claim 1, wherein:
   the first transistor is a thick gate N type Metal-Oxide-Semiconductor Field Effect Transistor (TGNMOS);
   the second transistor is a first thick gate P type Metal-Oxide-Semiconductor Field Effect Transistor (TGPMOS); and
   the third transistor is a second TGPMOS.

10. The apparatus of claim 1, wherein:
the first voltage is substantially lower than the second voltage.

11. A system comprising:
a memory to store instructions;
a processor circuitry coupled to the memory, the processor circuitry to execute the instructions;
a wireless interface to allow the processor circuitry to communicate with another system;
a first circuitry to selectively output a first voltage to a node;
a second circuitry to selectively output from a selection a second voltage or a ground voltage during operation of the second circuitry, the processor circuitry to control an operation of one or both the first circuitry or the second circuitry;
a first transistor and a second transistor coupled between the node and the second circuitry, wherein a gate of the first transistor is to receive a control signal at the first voltage or the ground voltage during operation of the first circuitry; and
an arrangement to provide, to a gate of the second transistor, one of: substantially the first voltage or substantially zero volts.

12. The system of claim 11, wherein the arrangement comprises:
a third transistor coupled between the gate of the second transistor and the node, a gate of the third transistor to receive the control signal at the first voltage.

13. The system of claim 12, wherein the arrangement comprises:
one or more pull-down transistors between the gate of the second transistor and a ground terminal.

14. The system of claim 13, wherein:
a gate of a first pull-down transistor of the one or more pull-down transistors is to receive the control signal at the first voltage.

15. The system of claim 14, wherein:
a gate of a second pull-down transistor of the one or more pull-down transistors to receive a mode signal that is based on an operational mode of the first and second circuitries, the first pull-down transistor and the second pull-down transistor coupled in series.

16. The system of claim 15, further comprising:
a circuitry to: generate the mode signal at substantially the second voltage when the second circuitry is to be active, and generate the mode signal at substantially zero volts when the first circuitry is to be active.

17. An apparatus comprising:
a first circuitry that is to selectively output from a selection a first voltage or a ground voltage, during operation of the first circuitry, at a first output terminal;
a second circuitry that is to selectively output from a selection a second voltage at a second output or a ground voltage, during operation of the second circuitry, terminal;
a pair of parallel transistors coupled between the first output terminal and the second output terminal, the pair comprising first and second transistors, wherein a gate of the first transistor is to receive a control signal at the first voltage; and
a third transistor to selectively couple a gate of the second transistor to the second output terminal, a gate of the third transistor to receive the control signal at the first voltage.

18. The apparatus of claim 17, further comprising:
a fourth transistor and a fifth transistor in series, wherein the fourth and fifth transistors are to selectively couple the gate of the second transistor to a ground terminal.

19. The apparatus of claim 18, wherein:
a gate of the fourth transistor is to receive the control signal at the first voltage.

20. The apparatus of claim 18, wherein:
a gate of the fifth transistor is to receive a mode signal that is based on an operational mode of the apparatus.

21. An apparatus comprising:
a pass-gate having a first transistor controllable by a first node at a first voltage or a ground voltage, and a second transistor coupled in parallel to the first transistor and controllable by a second node at a second voltage, the second voltage higher than the first voltage;
a third transistor controllable by the first node, wherein the third transistor is coupled to the second node;
a fourth transistor controllable by the first node, wherein the fourth transistor is coupled to the second node, and the first and second transistors of the pass-gate;
a first circuitry coupled to the pass-gate at a first end of the pass-gate;
a second circuitry coupled to the pass-gate at a second end of the pass-gate, wherein the first circuitry operates at the first voltage while the second circuitry operates at the second voltage.

22. The apparatus of claim 21 comprises a fifth transistor coupled in series with the third transistor and a ground rail, wherein the fifth transistor is controllable by a mode signal.

23. The apparatus of claim 21, wherein while the second circuitry is active and the first circuitry is inactive, substantially the first voltage is provided at a gate of the first transistor, and substantially the second voltage is provided at a gate of the second transistor.

24. The apparatus of claim 21, wherein while the second circuitry is inactive and the first circuitry is active, substantially ground voltage is provided at a gate of the first transistor, and substantially the second voltage is provided at a gate of the second transistor.

25. The apparatus of claim 21, wherein the first circuitry comprises one of: circuitry with low voltage differential signaling, circuitry with mobile industry processor interface, circuitry with scalable low voltage signaling interface, or a double data rate interface.

\* \* \* \* \*